US 6,551,914 B1

(12) United States Patent
Suzuki et al.

(10) Patent No.: US 6,551,914 B1
(45) Date of Patent: Apr. 22, 2003

(54) METHOD OF FORMING POLISH STOP BY PLASMA TREATMENT FOR INTERCONNECTION

(75) Inventors: Mieko Suzuki, Tokyo (JP); Akira Kubo, Tokyo (JP)

(73) Assignee: NEC Electronics Corporation (JP)

( * ) Notice: Subject to any disclaimer, the term of this patent is extended or adjusted under 35 U.S.C. 154(b) by 79 days.

(21) Appl. No.: 09/634,940

(22) Filed: Aug. 8, 2000

Related U.S. Application Data

(62) Division of application No. 09/050,635, filed on Mar. 27, 1998, now abandoned.

(30) Foreign Application Priority Data

Mar. 31, 1997 (JP) ............................... 9-079497

(51) Int. Cl.$^7$ ............................... H01L 21/44
(52) U.S. Cl. ............... 438/597; 438/672; 438/771; 438/776
(58) Field of Search ................... 438/597, 669, 438/672, 740, 771, 776, 902, 970, 618, 622, 633, 634, 692

(56) References Cited

U.S. PATENT DOCUMENTS

| 5,592,024 A | * | 1/1997 | Aoyama et al. | ............ 257/751 |
| 5,821,168 A | * | 10/1998 | Jain | ............ 216/18 |
| 5,886,410 A | * | 3/1999 | Chiang et al. | ............ 257/759 |
| 5,891,513 A | * | 4/1999 | Dubin et al. | ............ 427/305 |
| 5,916,011 A | * | 6/1999 | Kim et al. | ............ 451/287 |
| 6,004,729 A | * | 12/1999 | Bae et al. | ............ 427/307 |

OTHER PUBLICATIONS

Wolf, Silicon Processing for the VLSI Era, 1990, Lattice Press, vol. 2, 194–198.*
Chang et al, ULSI Technology, 1996, McGraw–Hill Companies, Inc., 244–248.*

* cited by examiner

Primary Examiner—Matthew Smith
Assistant Examiner—Craig P. Lytle
(74) Attorney, Agent, or Firm—Hayes Soloway P.C.

(57) ABSTRACT

A semiconductor device in which an interconnection material is buried in a hole formed in an interlevel insulating film arranged on a semiconductor substrate includes a protective layer formed on the surface of the interlevel insulating film that has a lower polishing rate than that of the interconnection material in chemical mechanical polishing. A method of manufacturing this semiconductor device is also disclosed.

10 Claims, 3 Drawing Sheets

METHOD OF FORMING POLISH STOP BY PLASMA TREATMENT FOR INTERCONNECTION

This is a divisional of application Ser. No. 09/050,635 filed Mar. 27, 1998, abandoned.

BACKGROUND OF THE INVENTION

1. Field of the Invention

The present invention relates to a semiconductor device having a structure in which an interconnection is buried in an opening formed in an interlevel insulating film and, more particularly, to a semiconductor device in which damage to an interlevel insulating film is prevented to increase the manufacturing yield, and a method of manufacturing the same.

2. Description of the Prior Art

With recent high integration degrees of semiconductor devices, micropatterning of interconnections is demanded. For such a fine interconnection, contact and through holes for connecting conductive layers or interconnections respectively formed on the upper and lower surfaces of an interlevel insulating film must be particularly small. For this purpose, the structure of a contact or through hole in which an opening reaching a lower conductive layer or interconnection is formed in an interlevel insulating film, and an interconnection material is buried in this opening is proposed. For example, according to the technique disclosed in Japanese Unexamined Patent Publication No. 5-275366, as shown in FIG. 1A, a first metal interconnection 12 on a semiconductor substrate 11 is covered with an interlevel insulating film 13, then a via hole 14 is formed in the interlevel insulating film 13, and a tungsten film 15 is formed on the entire surface including the via hole 14. The tungsten film 15 is polished by chemical mechanical polishing (to be referred to as CMP hereinafter) until the tungsten film 15 on the surface of the interlevel insulating film 13 is removed. As a result, the tungsten film 15 is left only in the via hole 14. A plug (through hole) is formed in this manner, and permits one to electrically connect the first metal interconnection 12 to a second metal interconnection 16 to be formed.

Since the plug structure using CMP has high flatness on the surface of the interlevel insulating film 13, the coverage of the second upper metal interconnection 16 is high, and so-called poor step coverage and the like can be prevented, which is advantageous in micropatterning the interconnection. In this CMP, however, if the tungsten film 15 is excessively polished, the surface of the interlevel insulating film 13 is also polished and may be scratched. That is, a slurry of alumina particles is used as an abrasive in polishing the tungsten insulating film 13 along with the progress of the polishing, scratches 13a are generated on the surface of the interlevel insulating film 13 by hard alumina particles, as shown in FIG. 1B.

The generation of scratches adversely affects the cladding of the second metal interconnection 16 formed on the surface of the interlevel insulating film 13, pattern etching, and the like. Consequently, the reliability of the resultant semiconductor device decreases, and the manufacturing yield also greatly decreases.

SUMMARY OF THE INVENTION

The present invention has been made in consideration of the above situation in the prior art, and has as its object to provide a semiconductor device and manufacturing method in which the surface of an interlevel insulating film is prevented from being scratched in a CMP process, thereby increasing the reliability and the yield.

To achieve the above object, according to the first aspect of the present invention, there is provided a semiconductor device in which an interconnection material is buried in a hole formed in an interlevel insulating film arranged on a semiconductor substrate, comprising a protective layer formed on a surface of the interlevel insulating film that has a lower polishing rate than a polishing rate of the interconnection material in chemical mechanical polishing.

According to the second aspect of the present invention, there is provided a semiconductor device wherein the protective layer in the first aspect has a polishing rate ratio of not less than 10 to the interconnection material in chemical mechanical polishing.

According to the third aspect of the present invention, there is provided a semiconductor device wherein the protective layer in the first aspect is a reaction layer formed by performing, for the surface of the interlevel insulating film, plasma processing using at least one kind of gas selected from the group consisting of $NH_3$ gas and $N_2$ gas.

According to the fourth aspect of the present invention, there is provided a semiconductor device wherein the protective layer in the second aspect is a plasma oxide film formed on the surface of the interlevel insulating film.

According to the fifth aspect of the present invention, there is provided a method of manufacturing a semiconductor device, comprising the steps of forming an interlevel insulating film on a semiconductor substrate, forming a protective layer with a low polishing rate in chemical mechanical polishing on a surface of the interlevel insulating film, forming a hole in the interlevel insulating film, forming an interconnection material on the surface of the interlevel insulating film including the hole, and forming an interconnection by chemically mechanically polishing the interconnection material so as to leave the interconnection material in only the hole.

According to the sixth aspect of the present invention, there is provided a semiconductor device manufacturing method wherein the protective layer in the fifth aspect is a reaction layer formed by performing, for the surface of the interlevel insulating film, plasma processing using at least one kind of gas selected from the group consisting of $NH_3$ gas and $N_2$ gas.

According to the seventh aspect of the present invention, there is provided a semiconductor device manufacturing method, further comprising the step of forming, as the protective layer in the fifth aspect, a plasma oxide film having a polishing rate ratio of not less than 10 to the interconnection material in chemical mechanical polishing.

As is apparent from the respective aspects, according to the present invention, the plasma processing layer or plasma oxide film is formed as a protective layer on the surface of the interlevel insulating film by plasma processing using $NH_3$ gas or $N_2$ gas. In polishing by CMP the interconnection material formed on the interlevel insulating film, the protective film protects the surface of the interlevel insulating film to prevent this surface from being scratched. With this structure, an upper interconnection layer and an insulating film can be formed with high quality, and high reliability and high manufacturing yield of the semiconductor device can be obtained.

The above and many other advantages, features and additional objects of the present invention will become manifest to those versed in the art upon making reference to the following detailed description and accompanying drawings in which preferred embodiments incorporating the principles of the present invention are shown by way of illustrative examples.

DETAILED DESCRIPTION OF PREFERRED EMBODIMENTS

Several preferred embodiments of the present invention will be described below with reference to the accompanying drawings.

Figure 1A:
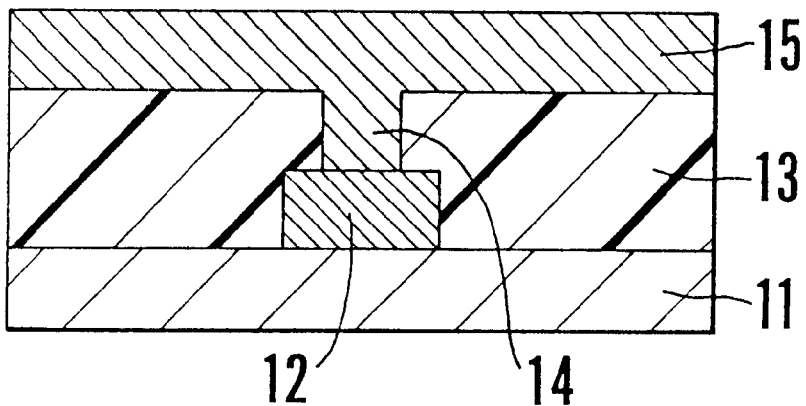
FIGS. 1A and 1B are sectional views respectively showing the main manufacturing steps in an example of conventional semiconductor manufacturing methods.
Figure 1B:
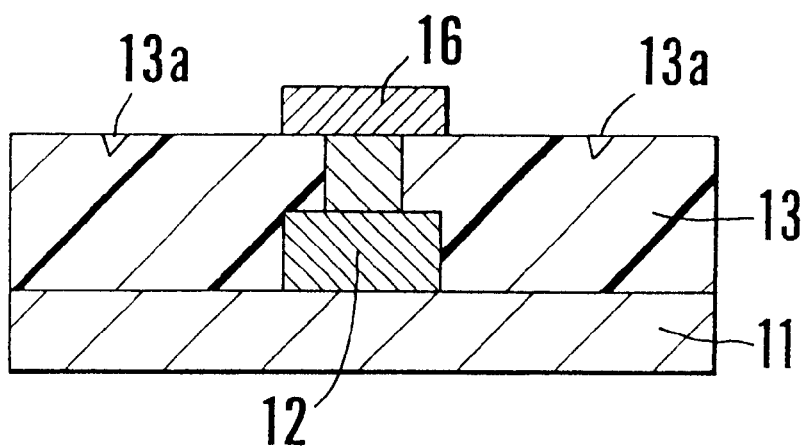
Figure 2A:
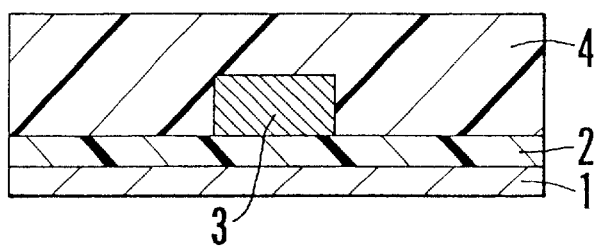
FIGS. 2A to 2E are sectional views respectively showing the main manufacturing steps in the first embodiment of the present invention.
Figure 2B:
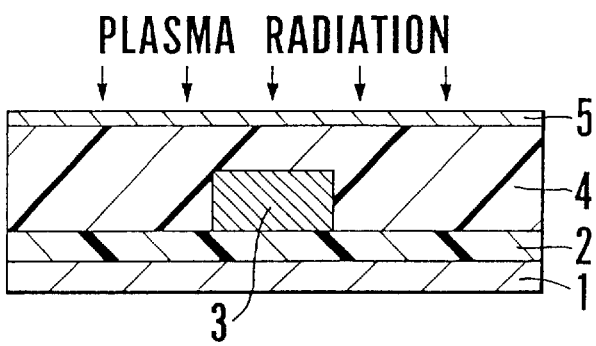

FIGS. 2A to 2E are sectional views respectively showing the main manufacturing steps in the first embodiment of the present invention. As shown in FIG. 2A, after a first metal interconnection 3 with a predetermined pattern is formed on a silicon oxide film 2 on the surface of a semiconductor substrate 1, an interlevel insulating film 4 made of a BPSG film is formed to cover the first metal interconnection 3, and the surface of the interlevel insulating film 4 is planarized. As shown in FIG. 2B, plasma radiation within an atmosphere of $NH_3$ gas is performed on the surface of the interlevel insulating film 4 to form a plasma nitride layer 5 as a protective layer on the surface of the interlevel insulating film 4. The $NH_3$ plasma processing is performed at a power of 3A, a pressure of 300 mTorr, an $NH_3$ gas flow rate of 600 sccm, and a substrate setting temperature of 300° C. for 30 min.

Figure 2C:
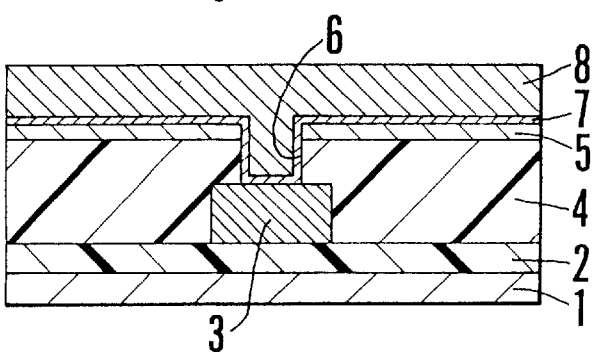
Figure 2D:
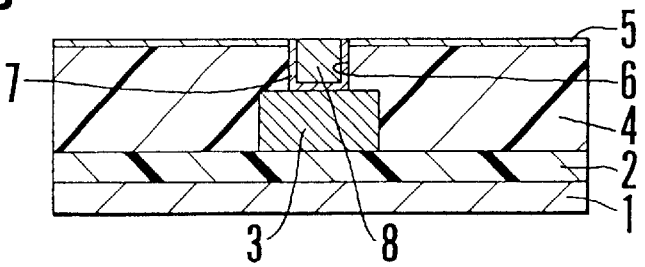
Figure 2E:
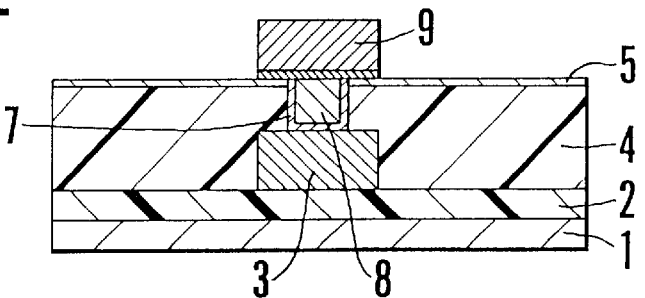

As shown in FIG. 2C, a portion of the interlevel insulating film 4 immediately above the first metal interconnection 3 is selectively etched to form a via hole 6. A titanium nitride film 7 as a barrier metal film is grown to about 500 Å as an adhesion film on the entire surface including the via hole 6, and a tungsten film 8 as an interconnection film material is grown to about 5,000 Å on the titanium nitride film 7. Then, the tungsten film 8 and the titanium nitride film 7 are polished by CMP using a slurry mixture of alumina abrasive particles and an oxidizing agent. This polishing is performed until the surface of the protective layer 5 is exposed. As a result, the tungsten film 8 and the titanium nitride film 7b are left in only the via hole 6 to form a tungsten plug, as shown in FIG. 2D. As shown in FIG. 2E, a metal film made up of a 500-Å thick titanium nitride film and a 4,500-Å thick copper film is formed on the entire surface, and shaped into a predetermined pattern, thereby forming a second metal interconnection 9. The tungsten plug electrically connects, as a through hole, the second metal interconnection 9 to the first metal interconnection 3.

In this way, according to this semiconductor device and manufacturing method, the plasma nitride layer 5 is formed on the surface of the interlevel insulating film 4 using NH, gas. Since the plasma nitride layer 5 is resistant to polishing by CMP, it can increase, as a protective layer, the resistance of the surface of the interlevel insulating film 4 to polishing by CMP. In general, the CMP polishing rate of the plasma nitride layer 5 is 10 times or higher the CMP polishing rate of the tungsten film 8. For this reason, upon polishing the tungsten film 8 by CMP, even if the polishing is excessively performed to polish the surface of the interlevel insulating film 4, the surface of the interlevel insulating film 4 can be prevented from being scratched because of the resistance of the protective layer 5 to polishing. Accordingly, the reliability of the second metal interconnection 9 formed on the surface of the interlevel insulating film 4, and that of an upper insulating film (not shown) are increased, resulting in high reliability and high manufacturing yield of the semiconductor device.

The plasma radiation can be conducted within an atmosphere of $N_2$ gas also, and the same effects as those described above can be obtained as far as the power falls within the range of 2 to 4 A, the pressure within the range of 200 to 400 mTorr, the gas flow rate within the range of 300 to 1,000 sccm, the substrate setting temperature within the range of 200 to 350° C., and the time within the range of 10 to 60 min. The thickness of the titanium nitride film 7 serving as a barrier metal falls within only the range of 250 to 500 Å, and the same effects as those described above can also be obtained by a multilayer of a titanium nitride film and a titanium film. The thickness of the tungsten film 8 falls within only the range of 4,000 to 8,000 Å. The abrasive particles used in CMP may be silica abrasive particles, and the conditions of silica abrasive particles are a constant disk rotation speed of 10 to 70 rpm, a carrier rotation speed of 10 to 70 rpm, a load of 2 to 8 psi, a lower surface load of 0 to 4 psi, and a slurry flow rate of 50 to 200 cc/min.

Figure 3A:
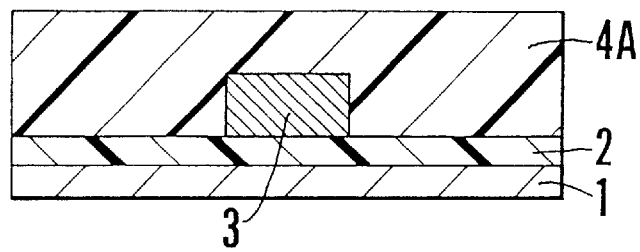
FIGS. 3A to 3E are sectional views respectively showing the main manufacturing steps in the second embodiment of the present invention.
Figure 3B:
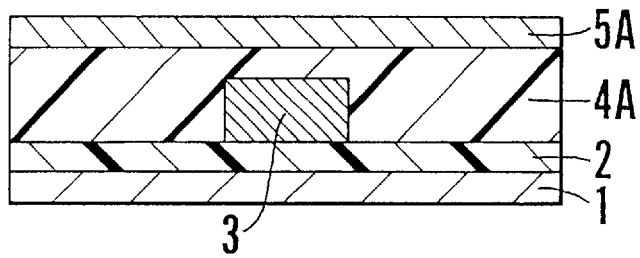
Figure 3C:
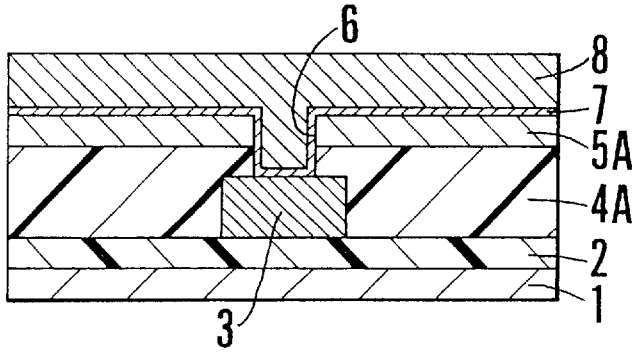
Figure 3D:
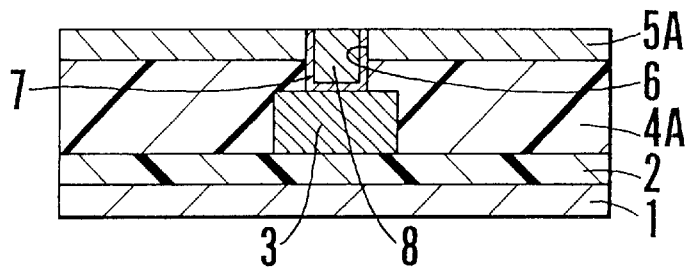
Figure 3E:
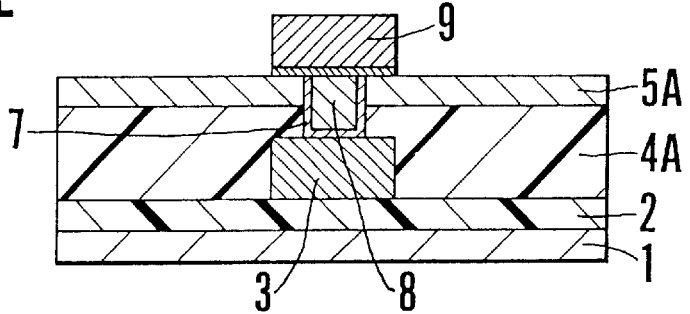

FIGS. 3A to 3E are sectional views respectively showing the main manufacturing steps in the second embodiment of the present invention. As shown in FIG. 3A, a first interlevel insulating film 4A is formed and planarized on a semiconductor substrate 1 having a first metal interconnection 3. In this case, as the interlevel insulating film 4A, an 8,000-Å thick BPSG film is formed. As shown in FIG. 3B, a plasma oxide film 5A is grown to a thickness of 2,000 Å on the surface of the interlevel insulating film 4A at a low CMP polishing rate and a polishing rate selectivity of 10 or more to a tungsten film. As shown in FIG. 3C, the plasma oxide film 5A and the interlevel insulating film 4A are selectively etched to form a via hole 6. A titanium nitride film 7 as a barrier metal film is grown to about 500 Å as an adhesion film on the entire surface including the via hole 6, and a tungsten film 8 as an interconnection film material is grown to about 5,000 Å on the titanium nitride film 7. Then, the tungsten film 8 and the titanium nitride film 7 are polished by CMP using a slurry mixture of alumina abrasive particles and an oxidizing agent, thereby forming a tungsten plug like the one shown in FIG. 3D. As shown in FIG. 3E, a 500-Å thick titanium nitride film and a 4,500-Å thick Al—Cu film are successively sputtered and shaped into a predetermined pattern, thereby forming a second metal interconnection 9.

Also in the second embodiment, the plasma oxide film 5A formed on the surface of the interlevel insulating film 4A functions as a protective layer, which prevents the surface of the interlevel insulating film 4A from being scratched by CMP polishing. Accordingly, the reliability of the second metal interconnection 9 formed on the surface of the interlevel insulating film 4A, and that of an upper insulating film (not shown) are increased, resulting in high reliability and high manufacturing yield of the semiconductor device.

In the second embodiment, the thickness of the BPSG film used as the interlevel insulating film 4A falls within only the range of 6,000 to 8,000 Å. The plasma oxide film 5A formed on the BPSG film has only a polishing rate ratio of 10 or more to the tungsten film 8, and the same effects as those described above can be obtained as far as the thickness of the plasma oxide film 5A falls within the range of 500 to 2,000 Å. The thickness of the titanium nitride film 7 serving as a barrier metal falls within only the range of 250 to 500 Å, and the same effects as those described above can be obtained by a multilayer of a titanium nitride film and a titanium film. The thickness of the tungsten film 8 formed on the entire surface falls within only the range of 4,000 to 8,000 Å. The abrasive particles used in CMP may be silica abrasive particles, and the conditions of silica abrasive particles are the same as those in the first embodiment.

What we claim is:

1. A method of manufacturing a semiconductor device, comprising the steps of:

forming a first metal interconnection on a semiconductor substrate by the interposition of a silicon oxide film;

forming an interlevel insulating film on the semiconductor substrate;

forming a protective layer with a low polishing rate in chemical mechanical polishing in a surface of said interlevel insulating film by performing, for the surface of said interlevel insulating film, plasma processing using a gas selected from the group consisting of $NH_3$ gas, $N_2$ gas, and a mixture thereof;

forming a hole through said protective layer and in said interlevel insulating film to reach an upper surface of said first metal interconnection;

forming a barrier metal film on the surface of said interlevel insulating film including side wall and bottom wall surfaces of the hole;

forming an interconnection film material on said barrier metal film;

forming an interconnection by applying chemical mechanical polishing to said interconnection film material and said barrier metal film, in which the polishing is also applied to at least a surface of said protective layer without polishing the surface of said interlevel insulating film, so as to leave interconnection material and barrier metal in only the hole; and forming a second metal interconnection on the surface of said protective layer.

2. A method according to claim 1, wherein said interlevel insulating film is formed of a BPSG film material.

3. A method according to claim 2, wherein said interlevel insulating layer is formed to a thickness of between 6,000 Å and 8,000 Å.

4. A method according to claim 1, wherein said interconnection film material is formed of tungsten.

5. A method according to claim 1, wherein said second metal interconnection is formed of a TiN film and a Cu film.

6. A method of manufacturing a semiconductor device, comprising the steps of:

forming a first metal interconnection on a semiconductor substrate by the interposition of a silicon oxide film;

forming an interlevel insulating film on a semiconductor substrate;

forming a protective layer comprising a plasma oxide film having a polishing rate ratio of not less than 10 to the interconnection material in chemical mechanical polishing in a surface of said interlevel insulating film;

forming a hole through said protective layer in said interlevel insulating film to reach an upper surface of said first metal interconnection;

forming a barrier metal film on the surface of said interlevel insulating film including sidewall and bottom wall surfaces of the hole;

forming an interconnection film material on said barrier metal film;

forming an interconnection by chemical mechanical polishing to said interconnection film material and said barrier metal film in which the polishing is also applied to at least a surface of said protective layer without polishing the surface of said interlevel insulating film, so as to leave interconnection material and barrier metal in only the hole; and forming a second metal interconnection on the surface of said protective layer.

7. A method according to claim 6, wherein said interlevel insulating film is formed of a BPSG film material.

8. A method according to claim 7, wherein said interlevel insulating layer is formed to a thickness of between 6,000 Å to 8,000 Å.

9. A method according to claim 6, wherein said protective layer is formed to a thickness of 250 Å and 500 Å.

10. A method according to claim 6, wherein said second metal interconnection is formed of a TiN film and a Cu film.

* * * * *